(12) United States Patent
Kanou et al.

(10) Patent No.: US 7,871,564 B2
(45) Date of Patent: Jan. 18, 2011

(54) HIGH-PURITY RU ALLOY TARGET, PROCESS FOR PRODUCING THE SAME, AND SPUTTERED FILM

(75) Inventors: Gaku Kanou, Ibaraki (JP); Yuichiro Shindo, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 361 days.

(21) Appl. No.: 12/088,875

(22) PCT Filed: Jun. 19, 2006

(86) PCT No.: PCT/JP2006/312216

§ 371 (c)(1), (2), (4) Date: Apr. 1, 2008

(87) PCT Pub. No.: WO2007/043215

PCT Pub. Date: Apr. 19, 2007

(65) Prior Publication Data

US 2009/0280025 A1    Nov. 12, 2009

(30) Foreign Application Priority Data

Oct. 14, 2005 (JP) .............................. 2005-299505

(51) Int. Cl.
*C22C 5/04* (2006.01)
(52) U.S. Cl. .................. 420/462; 148/430; 204/298.12; 204/298.13
(58) Field of Classification Search ................. 148/430; 204/298.12, 298.13; 420/462
See application file for complete search history.

(56) References Cited

U.S. PATENT DOCUMENTS

| | | | |
|---|---|---|---|
| 6,036,741 | A | 3/2000 | Shindo et al. |
| 6,284,013 | B1 | 9/2001 | Shindo et al. |
| 6,589,311 | B1 | 7/2003 | Han et al. |
| 7,578,965 | B2 | 8/2009 | Shindo et al. |
| 2004/0144204 | A1 | 7/2004 | Hisano |
| 2007/0175753 | A1 | 8/2007 | Hisano |
| 2007/0240992 | A1 | 10/2007 | Shindo et al. |
| 2009/0114535 | A1 | 5/2009 | Oda |

FOREIGN PATENT DOCUMENTS

WO    2005/083136 A1    9/2005

OTHER PUBLICATIONS

ASM datasheet of Unclassified miscellaneous alloy, Grade 99.90 (ASTM B717(96)). 2002.*
Esp@cenet database, One Page English Abstract of JP 2004-346392 A1, Dec. 9, 2004.
Esp@cenet database, One Page English Abstract of JP 2004-156114 A1, Jun. 3, 2004.
Esp@cenet database, One Page English Abstract of JP 2002-133653 A1, May 10, 2002.
Esp@cenet database, One Page English Abstract of JP 09-041131 A1, Feb. 10, 1997.
Esp@cenet database, One Page English Abstract of JP 2000-178721 A1, Jun. 27, 2000.
Esp@cenet database, One Page English Abstract of JP 2000-178722 A1, Jun. 27, 2000.
Esp@cenet database, One Page English Abstract of JP 2003-277924 A1, Oct. 2, 2003.

* cited by examiner

*Primary Examiner*—Scott Kastler
*Assistant Examiner*—Brian Walck
(74) *Attorney, Agent, or Firm*—Howson & Howson LLP

(57) ABSTRACT

In order to obtain a high purity sputtered film for a capacitor electrode of a semiconductor memory and to make the sputtered film have uniform thickness and good adhesiveness with Si substrate, a high-purity Ru alloy target is provided, wherein a total content of the platinum group elements excluding Ru is in a range of 15 to 200 wtppm and remnants are Ru and inevitable impurities. Also, provided is a manufacturing method of the high-purity Ru alloy target, comprising the steps of mixing Ru powder having a purity of 99.9% or higher and powder of platinum group elements excluding Ru, performing press molding of the mixed powder to obtain a compact, performing electron beam melting of the compact to obtain an ingot, and forging the ingot at 1400 to 1900° C.

5 Claims, No Drawings

HIGH-PURITY RU ALLOY TARGET, PROCESS FOR PRODUCING THE SAME, AND SPUTTERED FILM

BACKGROUND OF THE INVENTION

The present invention pertains to a high-purity Ru alloy target for sputtering having a purity of 3N (99.9%) or higher and which is suitable in forming a capacitor electrode material of a semiconductor memory, a manufacturing method of the foregoing Ru alloy target, and a high-purity Ru alloy sputtered film obtained by sputtering this Ru alloy target.

Today, the use of Ru as an electrode material or the like of a semiconductor capacitor is rapidly expanding. This kind of electrode is generally formed by sputtering a Ru target.

In order to guarantee the operational performance as a reliable semiconductor, it is important to reduce as much as possible impurities in the foregoing materials formed after sputtering that are harmful to the semiconductor device. In other words, it is desirable to reduce the following impurities as much as possible, and realize a purity of 3N or higher, namely 99.9% (weight) or higher:

alkali metal elements such as Na and K;
radioactive elements such as U and Th; and
transition metal elements such as Fe, Ni, Co, Cr and Cu.

The reason the foregoing impurities are harmful is that alkali metals such as Na and K move easily in the gate insulator and cause the MOS-LSI interfacial quality to deteriorate, radioactive elements such as U and Th cause a soft error of elements due to the α rays emitted from such elements, and transition metal elements such as Fe, Ni, Co, Cr and Cu contained as impurities cause trouble at the interface bonding.

Among the above, the harmful effect of alkali metals such as Na and K is particularly pointed out.

Although a target is generally prepared by the powder sintering method, an Ru target based on a conventional powder sintering method entails numerous problems such as high-impurity concentration; particularly, high concentration of alkali metals such as Na and Ka, which leads to the deterioration in characteristics of high-integrated semiconductors, and high concentration of gas components such as C and O, which leads to the generation of numerous particles during sputtering deposition.

In order to overcome the foregoing problems of a Ru target prepared by the powder sintering method, preparation of a target by the dissolution method is being considered. Nevertheless, since the Ru target prepared by the dissolution method has large crystal grains, the sputtering ratio will differ depending on the crystal face, and there is problem in that the film thickness distribution of the Ru sputtered film will become uneven.

As manufacturing technology of conventional dissolution methods, there are the following. A sputtering target comprising Si at 1 to 9 ppm and Ru as remnants at 99.998% or higher, and powder for manufacturing such a sputtering target (Patent Document 1); a molten target comprising Ru having a purity level of 99.998% or higher, wherein the oxygen contained in this molten target is 0.1 to 20 ppm (Patent Document 2); a ruthenium sputtering target obtained by plasma-arc melting or arc melting, wherein hydrogen is 5 ppm or less, and tungsten or tantalum is 5 ppm or less (Patent Document 3); and a sputtering target obtained by cutting the top and bottom faces of a ruthenium ingot having a purity level of 3N or higher obtained by the dissolution method, and performing compression forming to the cut ingot at a prescribed temperature and surface pressure (Patent Document 4).

Nevertheless, as a sputtering target material to be used in forming a capacitor electrode material of a semiconductor memory, characteristics where the generation of particles during deposition is minimal and the film thickness distribution is uniform are required, but there is a problem in that such characteristics of the foregoing Patent Documents are insufficient under the existing circumstances.

[Patent Document 1]
Japanese Patent Laid-Open Publication No. 2000-178721

[Patent Document 2]
Japanese Patent Laid-Open Publication No. 2000-178722

[Patent Document 3]
Japanese Patent Laid-Open Publication No. 2003-277924

[Patent Document 4]
Japanese Patent Laid-Open Publication No. 2004-156114

SUMMARY OF THE INVENTION

An object of the present invention is to provide a high-purity Ru alloy target for sputtering and its manufacturing method, which are capable of reducing harmful substances as much as possible, refining the crystal grains as much as possible so as to make the film thickness distribution during deposition to be uniform, and preventing deterioration in adhesiveness with an Si substrate, and which are suitable in forming a capacitor electrode material of a semiconductor memory, as well as a high-purity Ru alloy sputtered film obtained by sputtering this Ru alloy target.

In order to achieve the foregoing object, the present invention provides:

1) A high-purity Ru alloy target, wherein the content of platinum group elements excluding Ru is 15 to 200 wtppm and remnants are Ru and inevitable impurities;
2) The high-purity Ru alloy target according to paragraph 1) above, wherein the average crystal grain size of the target is 1.5 mm or less;
3) A manufacturing method of a high-purity Ru alloy target, wherein the content of platinum group elements excluding Ru is 15 to 200 wtppm and remnants are Ru and inevitable impurities, including the steps of mixing Ru powder having a purity level of 99.9% or higher and powder of platinum group elements excluding Ru, performing press molding the mixed powder to obtain a compact, performing electron beam melting to the compact to obtain an ingot, and performing forge processing to the ingot to obtain a target:
4) The manufacturing method of a high-purity Ru alloy target according to paragraph 3) above, wherein the average crystal grain size of the target after forging is 1.5 mm or less; and
5) A high-purity Ru alloy sputtered film, wherein the content of platinum group elements excluding Ru is 15 to 200 wtppm and remnants are Ru and inevitable impurities.

The present invention yields superior effects of enabling to provide a high-purity Ru alloy target for sputtering and its manufacturing method, which are capable of reducing harmful substances as much as possible, refining the crystal grains as much as possible so as to make the film thickness distribution during deposition to be uniform, and preventing deterioration in adhesiveness with an Si substrate, and which are suitable in forming a capacitor electrode material of a semiconductor memory, as well as a high-purity Ru alloy sputtered film obtained by sputtering this Ru alloy target.

DETAILED DESCRIPTION OF THE INVENTION

The high-purity Ru alloy target of the present invention is a high-purity Ru alloy target, wherein the content of platinum group elements excluding Ru is 15 to 200 wtppm and remnants are Ru and inevitable impurities. The platinum group elements to be added are Pt, Rh, Pd, Os and Ir, excluding Ru. Each of these elements yields the same effect, and may be arbitrarily selected. The total amount to be added is 15 to 200 wtppm.

If the additive amount is less than 15 wtppm, no effect will be yielded in refining the crystals. Together with the increase in the additive amount of the platinum group elements, the crystal grain size tends to become smaller. In this respect, it is desirable to increase the additive amount of the platinum group elements. Nevertheless, if the additive amount exceeds 200 wtppm, there is a problem in that the film may peel when sputtering is performed to a Si substrate. Therefore, it is desirable to keep the additive amount 200 wtppm or less.

Since the platinum group elements to be added are homologous to Ru, there is a significant characteristic in that no adverse effects will be inflicted on the electrical properties.

By making the content of platinum group elements excluding Ru 15 to 200 wtppm, it is possible to make the average crystal grain size of the target 1.5 mm or less. Refinement of the crystal grain size of the target yields a superior effect of making the film thickness distribution during deposition to be uniform.

As the manufacturing process, Ru powder having a purity level of 99.9% or higher and powder of platinum group elements excluding Ru are prepared in advance, these powders are mixed and subject to press molding to obtain a compact, and this compact is subject-to electron beam melting to obtain an ingot. Electron beam melting is an efficient method for effectively eliminating gas components and volatile components such as Na and K.

It is desirable that the content of the respective alkali metal elements such as Na and K in the target that move easily in the gate insulator and cause the MOS-LSI interfacial quality to deteriorate is kept at 10 wtppm or less, and the content of the respective radioactive elements such as U and Th that cause a soft error of elements due to the α rays emitted from such elements is kept at 10 wtppb or less.

Further, it is desirable to keep the total content of transition metal elements such as Fe, Ni, Co, Cr and Cu at 100 wtppm or less. Although transition metal elements do not have a significant impact as impurities on semiconductor equipment, it is desirable to keep the total content thereof at 100 wtppm or less.

Further, it is desirable to keep the total content of gas components such as oxygen, nitrogen and hydrogen at 1000 wtppm or less. This is in order to reduce the generation of particles. Preferably, the purity is 99.9% or higher, and more preferably 99.999% or higher.

The ingot obtained above is subject to forge processing, cut out into a prescribed shape, and subject to machining and polishing to obtain a target. Generally speaking, since the crystal grain size will increase when the forging temperature is raised, the forging temperature should be kept low to obtain fine crystal grains. Nevertheless, if the forging temperature is low, it will be difficult to process the target into a desired shape. Thus, it is desirable to perform forging in a range of 1400° C. to 1900° C. which satisfies the foregoing conditions. If the forging temperature exceeds 1900° C., this is undesirable since a liquid phase will appear and the structure will become uneven. Further, if the forging temperature is less than 1400° C., the ingot will become hard and forging will become difficult. Thus, the forging temperature shall be within the foregoing range.

The obtained target was a high-purity Ru alloy target, wherein the content of platinum group elements excluding Ru is 15 to 200 wtppm and remnants are Ru and inevitable impurities, and the average crystal grain size of the target is 1.5 mm or less.

As a result of using this target to perform sputtering onto a Si substrate or the like, it is possible to form a high-purity Ru alloy sputtered film, wherein the content of platinum group elements excluding Ru is 15 to 200 wtppm and remnants are Ru and inevitable impurities. This sputtered film is characterized in that the generation of particles is minimal during sputtering. Moreover, this sputtered film has minimal variation in the film thickness distribution and superior uniformity.

EXAMPLES

Examples of the present invention are now explained. These Examples merely illustrate a preferred example, and the present invention shall in no way be limited thereby. In other words, all modifications, other embodiments and modes covered by the technical spirit of the present invention shall be included in this invention.

Examples 1 to 9

After mixing commercially available Ru powder having a purity level of 3N and the platinum group elements to be added and performing press molding thereto, the obtained raw material was subject to electron beam melting. Commercially available Ru powder normally contains 5 to 10 wtppm of platinum group elements, and platinum group elements were added so that the total content would be 15 to 180 wtppm. This additive amount is shown in Table 1.

The ingot obtained by electron beam melting was subject to forge processing at 1500° C., cut out, and subject to machining and polishing to prepare a target.

The obtained target was used to perform sputtering onto a Si substrate, and, after performing deposition, the in-plane uniformity of the film thickness was evaluated. A superior effect was yielded in that the generation of particles during deposition was minimal.

Subsequently, the heating-cooling process in which the Si substrate was heated after Ru film deposition to 700° C. under Ar atmosphere and cooled to room temperature was repeated three times, and a peeling test in which a tape was attached to the Ru film and peeled off was conducted to evaluate the adhesiveness of the film and the Si substrate. Content of platinum group elements, average crystal grain size, status of film peeling, and film uniformity are shown in Table 1.

As evident from Table 1, in Examples 1 to 9, although the content of platinum group elements excluding Ru was 15 to 180 wtppm, the average crystal grain size became smaller together with the increase in the additive amount of the platinum group elements excluding Ru. Further, no peeling of the sputtered film could be acknowledged. The film thickness distribution, namely the difference between the thick portion and the thin portion, was within a range of 2 to 5%, and it is evident that a uniform film thickness distribution was obtained.

TABLE 1

| | | Total Concentration of Platinum Group Elements (ppm) | Rh Concentration (ppm) | Pd Concentration (ppm) | Os Concentration (ppm) | Ir Concentration (ppm) | Pt Concentration (ppm) | Average Crystal Grain Size (mm) | Peeling of Film | Film Thickness Distribution (%) |
|---|---|---|---|---|---|---|---|---|---|---|
| Examples | 1 | 15 | 3.1 | <0.05 | 4.8 | 2.6 | 4.3 | 1 | None | 5 |
| | 2 | 17 | 2.7 | 1.1 | 4.4 | 3.5 | 5.2 | 1.1 | None | 5 |
| | 3 | 19 | 2.4 | 1.8 | 5.7 | 3.2 | 5.6 | 1.2 | None | 5 |
| | 4 | 45 | 8.3 | 10 | 9.4 | 8.5 | 9.1 | 0.8 | None | 4 |
| | 5 | 48 | 10 | 10 | 10 | 9.3 | 9.0 | 0.9 | None | 4 |
| | 6 | 82 | 26 | 8.2 | 5.6 | 10 | 32 | 0.45 | None | 3 |
| | 7 | 96 | 6.4 | 28 | 23 | 35 | 3.3 | 0.4 | None | 3 |
| | 8 | 160 | 47 | 35 | 43 | 31 | 8.2 | 0.25 | None | 2 |
| | 9 | 180 | 41 | 32 | 30 | 44 | 36 | 0.2 | None | 2 |
| Comparative Examples | 1 | 5.1 | 1.2 | <0.05 | 0.8 | 0.7 | 2.4 | 2.7 | None | 15 |
| | 2 | 4.9 | 0.1 | 0.1 | 1.8 | 2.6 | 0.3 | 2.4 | None | 12 |
| | 3 | 7.1 | 2.1 | 1.6 | 1.4 | 1.5 | 0.5 | 2 | None | 12 |
| | 4 | 7.4 | 3.3 | 0.5 | 1.1 | 0.8 | 1.7 | 2.3 | None | 12 |
| | 5 | 310 | 91 | 42 | 63 | 24 | 89 | 0.15 | Peeling | 2 |
| | 6 | 350 | 73 | 66 | 68 | 67 | 74 | 0.12 | Peeling | 2 |
| | 7 | 370 | 75 | 77 | 72 | 69 | 72 | 0.13 | Peeling | 2 |

* The essential figure of concentration is two digits.

Comparative Examples 1 to 7

After adjusting commercially available Ru powder having a purity level of 3N and the platinum group elements excluding Ru so as to be less than 10 ppm or over 300 ppm as shown in Table 1, these powders were mixed and subject to press molding, and the obtained raw material was subject to electron beam melting.

The ingot obtained by electron beam melting was subject to forge processing at 1500° C. as with the Examples, cut out, and subject to machining and polishing to prepare a target. The obtained target was used to perform sputtering onto a Si substrate, and, after performing deposition, the in-plane uniformity of the film thickness was evaluated.

Subsequently, as with the Examples, the heating-cooling process in which the Si substrate was heated after Ru film deposition to 700° C. under Ar atmosphere and cooled to room temperature was repeated three times, and a peeling test in which a tape was attached to the Ru film and peeled off was conducted to evaluate the adhesiveness of the film and the Si substrate. Content of platinum group elements, average crystal grain size, status of film peeling, and film uniformity are shown in Table 1.

As evident from Table 1, in Comparative Examples 1 to 4, the content of platinum group elements excluding Ru was 4.9 to 7.4 wtppm, which is less than the condition of the present invention, but the average crystal grain size enlarged to 2 to 2.7 mm.

Sputtering was performed using this target. As a result, as shown in Table 1, although no peeling of the sputtered film could be acknowledged, the film thickness distribution, namely the difference between the thick portion and the thin portion, was within a range of 12 to 15%, and it is evident that an uneven film thickness distribution was obtained.

As shown in Table 1, in Comparative Examples 5 to 7, the content of platinum group elements excluding Ru was 310 to 370 wtppm, which is greater than the condition of the present invention, but the average crystal grain size was refined to 0.12 to 0.15 mm.

Sputtering was performed using this target. As a result, as shown in Table 1, the film thickness distribution, namely the difference between the thick portion and the thin portion, was within a range of 2%, and a uniform film thickness distribution was obtained. Contrarily, peeling of the sputtered film could be acknowledged, and it is evident that the excessive addition of platinum group elements excluding Ru is problematic.

The high-purity Ru alloy target of the present invention is a high-purity Ru alloy target, wherein the content of platinum group elements excluding Ru is 15 to 200 wtppm and remnants are Ru and inevitable impurities. Thus, it is possible to reduce the crystal grain size of the target and enables deposition with a uniform film thickness distribution. It is thereby possible to obtain a Ru thin film with extremely superior characteristics that is effective as an electrode material of a dielectric thin film memory.

The invention claimed is:

1. A high-purity Ru alloy target, wherein the content of platinum group elements excluding Ru is 15 to 200 wtppm and remnants are Ru and inevitable impurities, and wherein the content of radioactive elements U and Th in said target is respectively 10 wtppb or less.

2. The high-purity Ru alloy target according to claim 1, wherein the average crystal grain size of the target is 1.5 mm or less.

3. A Ru alloy sputtering target comprising a sputtering target made of an alloy including Ru, 15 to 200 wtppm of platinum group elements excluding Ru, and 10 wtppb or less of radioactive elements U and Th respectively, said platinum group elements excluding Ru consisting of Pt, Rh, Pd, Os and Ir.

4. A Ru alloy sputtering target consisting of a sputtering target body of an alloy consisting of Ru, 15 to 200 wtppm of platinum group elements excluding Ru, and inevitable impurities, said platinum group elements excluding Ru consisting of Pt, Rh, Pd, Os and Ir, said target having a purity of 3N (99.9%) or higher such that a content of said inevitable impurities is 0.1% (1,000 wtppm) or less, said inevitable impurities including 10 wtppb or less of radioactive elements U and Th, respectively.

5. A Ru alloy sputtering target according to claim 4, wherein said purity of said target is 4N (99.99%) or higher such that said content of said inevitable impurities is 0.01% (100 wtppm) or less.

\* \* \* \* \*

UNITED STATES PATENT AND TRADEMARK OFFICE
CERTIFICATE OF CORRECTION

PATENT NO. : 7,871,564 B2
APPLICATION NO. : 12/088875
DATED : January 18, 2011
INVENTOR(S) : G. Kanou et al.

It is certified that error appears in the above-identified patent and that said Letters Patent is hereby corrected as shown below:

Column 6, under Table 1 - Average Crystal Grain Size (mm) at line 5, "0.9" should read "0.8"

Signed and Sealed this
Twelfth Day of April, 2011

David J. Kappos
*Director of the United States Patent and Trademark Office*